United States Patent [19]

Rockett, Jr.

[11] Patent Number: 4,638,463
[45] Date of Patent: Jan. 20, 1987

[54] FAST WRITING CIRCUIT FOR A SOFT ERROR PROTECTED STORAGE CELL

[75] Inventor: Leonard R. Rockett, Jr., Washington, D.C.

[73] Assignee: International Business Machines Corporation, Armonk, N.Y.

[21] Appl. No.: 694,590

[22] Filed: Jan. 24, 1985

[51] Int. Cl.$^4$ .............................................. G11C 7/00
[52] U.S. Cl. ................................................... 365/205
[58] Field of Search ............... 365/154, 155, 156, 181, 365/190, 205

[56] References Cited

U.S. PATENT DOCUMENTS

| | | | |
|---|---|---|---|
| 4,314,359 | 2/1982 | Kato et al. | 365/179 |
| 4,404,661 | 9/1983 | Nagayama et al. | 365/203 |
| 4,448,400 | 5/1984 | Harari | 365/185 |

OTHER PUBLICATIONS

Electronics—May 22, 1980; pp. 119–129.

Primary Examiner—James W. Moffitt
Attorney, Agent, or Firm—John E. Hoel

[57] ABSTRACT

A fast writing circuit is disclosed for a soft error protected storage cell, such as a latch. The protected latch has a first input/output node and a second input/output node which are respectively connected to a charging source. The latch is connected to a first binary state input device which is enabled by a write-enable input, the first node being selectively charged during a write interval when the write-enable input is on, to represent a stored, first binary logic state for the latch. The soft error protection circuit includes an insulated gate, field effect capacitor having a diffusion electrode connected to the second node and having a gate electrode, for selectively loading the second node with an additional capacitance when its gate is biased with respect to the diffusion electrode. The soft error protection circuit further includes an inverter circuit having an input connected to the second node and an output for applying a capacitance enhancing bias to the gate electrode of the capacitor, for capacitively loading the second node. The fast writing circuit disclosed herein has an insulated gate field effect transistor disabling device having its source connected to ground potential, its drain connected to the gate to the capacitor and its gate connected to the write-enable input, for removing the bias on the gate of the capacitor in response to the write-enable input, thereby minimizing the capacitive load on the second node during the write interval. In this manner, the soft error protected latch can be written into at a faster rate than has been previously possible.

4 Claims, 13 Drawing Figures

LOW GATE-TO-CHANNEL
CAPACITANCE

HIGH GATE-TO-CHANNEL
CAPACITANCE

FAST WRITING CIRCUIT FOR A SOFT ERROR PROTECTED STORAGE CELL

FIELD OF THE INVENTION

The invention disclosed herein broadly relates to transistor circuits and more particularly relates to protective circuits for preserving the stored binary state of a transistor circuit storage device.

BACKGROUND OF THE INVENTION

As the number of devices in a very large scale integrated (VLSI) circuit chip surpasses $10^5$, the individual transistor devices which form its component elementary logic circuits, occupy areas of the chip on the order of a few square microns. The quantity of charge which is transferred between field effect transistor devices of this size while carrying out normal switching operations, is on the order of 0.1 picoCoulombs ($10^{-12}$ Coulombs), making them very susceptible to electrostatic perturbations.

One ubiquitous source of such perturbations is cosmic rays, a highly penetrating radiation apparently reaching the earth in all directions from outer space. The primary cosmic rays entering the earth's atmosphere are almost entirely composed of positively charged atomic nuclei which collide with air nuclei high in the atmosphere, forming showers of positively and negatively charged nuclear fragments called secondary cosmic rays. These secondary cosmic rays penetrate all matter at the earth's surface and as they pass through a material object, they undergo collisions with the electrons and nuclei of which the material is composed, leaving a track of electrostatic charge along the way. The linear charge density along such a track can be typically 0.3 picoCoulombs per micron, which is on the same scale as the quantity of charge involved in the switching operation of a single field effect transistor on a VLSI chip.

This becomes a significant problem in latch circuits composed of such devices, since a latch must sense and reliably store a binary bit of information for intervals measurable in millions of machine cycles. In order to better understand this problem, reference will be made to a typical integrated circuit field effect transistor latch and the mechanism of its response to an electrostatic perturbation such as a cosmic ray, will be discussed.

To begin this description, several terms need to be defined and suitable abbreviations established. The N channel field effect transistor circuit technology will be the example used herein. The abbreviation NFET will be used herein to refer to an N channel field effect transistor device. Such devices are generally fabricated by forming an N-type conductivity source diffusion and N-type drain diffusion in the surface of a P-type conductivity silicon substrate. The channel region of the substrate separating the source and drain regions, is covered by a gate insulator layer and a gate electrode. An enhancement mode NFET is normally nonconducting between its source and drain and it can be switched into conduction by applying a positive potential to its gate electrode, with respect to the potential of its source. A depletion mode NFET is normally conducting between its source and drain and it can be switched into nonconduction by applying a negative potential to its gate electrode, with respect to the potential of its source.

A typical NFET integrated circuit latch 6 is shown in a portion of FIG. 1. The latch 6 is a level sensitive scan design (LSSD) latch which stores one binary bit of information, and can be used either to store a test bit during test operations or it can store a data bit during normal logic function operations. The latch 6 consists of a pair of cross-coupled inverters. The first inverter is composed of the NFET enhancement mode active device 50 and the NFET depletion mode load device 52 which are series-connected between the drain potential Vdd at 10 of approximately five volts and ground potential. The convention is adopted that the drain potential of Vdd represents a binary logic value of "1" and ground potential represents a binary logic value of "0."

In normal operation, when a binary "1" signal of Vdd potential is applied by the node 8 to the gate of device 50, the gate of device 50 is positively biased with respect to its source and therefore it conducts the current supplied by the load device 52, dropping the potential of the output node 8' of the inverter to the binary "0," ground potential. Alternately, when a binary "0" signal of ground potential is applied by the node 8 to the gate of device 50, the gate of device 50 is not positively biased with respect to its source and therefore it no longer conducts the current supplied by the load device 52. Since the load device 52 is no longer conducting current, there is no longer a potential difference between its source and drain and therefore the potential of the output node 8' of the inverter rises to the binary "1," Vdd potential. Since the gate electrode is connected to the source for the load device 52, it is never negatively biased with respect to the source and therefore the load device is always capable of supplying current to the node 8' whenever the potential of the node 8' is less than the drain potential Vdd.

As can be seen from FIG. 1, the latch 6 is made up of two inverters, the first inverter being devices 50 and 52 and the second inverter being devices 70 and 72. The second inverter is identical to the first inverter, devices 50 and 70 being both NFET enhancement mode devices and devices 52 and 72 being both NFET depletion mode devices. By cross-coupling the output node 8' of the first inverter to the gate of the active device 70 of the second inverter and cross-coupling the output node 8 of the second inverter to the gate of the active device 50 of the first inverter, positive feedback reinforcement of the present conduction state of each respective inverter is obtained. It is in this manner that a binary bit of information can be stored in the latch. By convention, when the first node 8' is at a higher potential than the second node 8, the latch 6 will be storing a binary "1" value and when the first node 8' is at a lower potential than the second node 8, the latch 6 will be storing a binary "0" value. The state of the binary bit stored in the latch 6 can be read by sensing the relative potential of the first node 8' with respect to the second node 8.

In order to write a new data bit into the latch 6, a first data input circuit is connected to the first node 8' consisting of the series-connected NFET enhancement mode devices 12 and 16 and a second data input circuit is connected to the second node 8 consisting of the series-connected NFET enhancement mode devices 12' and 16. The gate of device 16 is connected to a write-enable (WE) input 14 which, when on, defines the write intervals when the state of the latch 6 can be changed. In LSSD terminology, the write-enable signal is also known as the "C-clock." If the DATA* input 15 to the gate of device 12 is on while the WE input 14 to the gate of device 16 is on, then the first node 8' is connected to ground potential and the latch 6 has its binary storage state changed to the "0" state. The use of the "*" notation herein following the expression for a binary logic variable, indicates the binary complement of that variable. Alternately, if the DATA input 15' to the gate of device 12' is on while the WE input 14 to the gate of device 16 is on, then the second node 8 is connected to ground potential and the latch 6 has its binary storage state changed to the "1" state. The latch 6 can also have test inputs to accept LSSD scan string test bits when circuit testing is desired.

The effect of an electrostatic perturbation, such as a cosmic ray, on the binary storage state of a latch can be better understood by examining the cross-sectional view of the structure of the first inverter in the latch 6, as is depicted in FIG. 2. The NFET enhancement mode active device 50 and the NFET depletion mode load device 52 are shown in FIG. 2 as being formed in the P-type silicon substrate 54. The load device 52 has its N-type drain 56 and its N-type source 58 formed in the P-type substrate 54, and the gate insulator and the gate electrode 60 formed over the channel region separating the source 58 and drain 56. The load device 52 is made a depletion mode by ion implanting an N-type dopant in the channel region thereof. The drain 56 is connected to the positive drain potential Vdd. The source 58 and the gate 60 are connected in common to the latch node 8'. The substrate 54 is connected to ground potential and therefore the source 58 and the drain 56, which are both N-type, form a reversed bias junction with the P-type substrate 54.

The active device 50 has its N-type drain 62 and its N-type source 64 formed in the P-type substrate 54, and the gate insulator and the gate electrode 66 formed over the channel region separating the source 64 and drain 62. The drain 62 is connected to the latch node 8' and the source 64 is connected to ground potential. When the latch 6 is in its binary "1" state, the first inverter has its output node 8' at the positive Vdd potential and the gate electrode 66 of the active device 50 is at ground potential, keeping the active device 50 nonconducting. The positive potential of the N-type drain diffusion 62 with respect to the ground potential of the substrate 54, creates a reversed bias PN junction 63 between the drain 62 and the substrate 54.

The reversed bias PN junction 63 forms a region which is depleted of charge carriers, bounded by a layer of electrons on the N-type side and by a layer of positive charges on the P-type side. This creates an electric field in the depleted region of junction 63 which will sweep out any free charges which may occur therein, causing a small current. If the electrostatically charged track of a cosmic ray 68 passes within the vicinity of the reversed bias PN junction 63, the charges liberated in the depletion region of the junction 63 are swept out, causing a current spike of up to 30 milliamperes for a duration of from 0.1 to 0.2 nanoseconds. The charges stored in the node 8' are conducted through the PN junction 63 to the substrate 54, thereby discharging the node 8', dropping its potential to as low as one forward biased PN junction potential difference below the potential of the substrate 54.

At this juncture, both the first node 8' and the second node 8 of the latch 6, are at approximately ground potential. Since both the depletion mode load 52 and the depletion mode load 72 are capable of supplying current to the nodes 8' and 8, respectively, whenever those nodes are at a lower potential than the drain potential Vdd, each load device 52 and 72 tries to drive its respective node 8' and 8 up in potential. Due to the random conditions of resistive and capacitive balance between the two nodes 8 and 8', the restored state of the latch 6 after the electrostatic perturbation is a random occurrence. If the restored state of the latch 6 is different from the original state prior to the perturbation, then a soft error has occurred. Another term for a soft error of this type is a single event upset, abbreviated SEU.

The copending patent application Ser. No. 682,120 filed 12-17-84 by J. S. Bialas, Jr., et al entitled "A Soft Error Protection Circuit for a Storage Cell," assigned to the IBM Corporation, provides a solution for this problem by applying an additional capacitance to the second node which prevents the second node from recharging as fast as the first node following the soft error event, by sinking a portion of the charge supplied from the charging source to the second node, the first node resuming its previously charged condition. The configuration and operation of protective circuit disclosed by Bialas, et al can be described as follows, with reference to FIG. 1.

The soft error protection circuit of FIG. 1 includes a first insulated gate, field effect capacitor 18 (herein abbreviated MOS capacitor 18) having a diffusion electrode 20 connected to the second node 8 and having a gate electrode 22, for selectively loading the second node 8 with a first additional capacitance when its gate 22 is biased with respect to the diffusion electrode 20.

FIGS. 3 and 4 show the cross-sectional view of the insulated gate field effect capacitor 18, hereinafter referred to as an MOS capacitor. The MOS capacitor 18 is composed of the N-type diffusion 20 which is formed in the surface of the P-type substrate 54, and is connected to the node 8 of the latch 6. The region of the substrate 54 adjacent to the end of the diffusion 20 is referred to as the channel region 75. Above the channel region 75 is positioned an insulating layer and above the insulating layer is the gate electrode 22. As is illustrated in FIG. 3, if the gate electrode 22 is not biased positively with respect to the diffusion 20, then the gate-to-channel capacitance of the MOS capacitor is very small. However, if the gate electrode 22 is biased positively with respect to the diffusion 20, as is shown in FIG. 4, then a sheet of negative charge 80 is formed in the channel region 75 beneath the gate electrode 22. This sheet of negative charge 80 is a charge mirror to the positive charges in the positively biased gate electrode. The sheet of negative charge 80 is a charge inversion layer which extends out from the diffusion 20 and which has the same potential as the diffusion 20. The sheet of charge 80 serves as one plate of a parallel plate capacitor, the other plate being the gate electrode 22. Thus, when the gate electrode of the MOS capacitor is positively biased with respect to the diffusion 20, a substantially large gate-to-channel capacitance is formed.

The MOS capacitor 18 can be formed from a conventional NFET enhancement mode device, as is shown in FIG. 1. It is not necessary to use both the source and the drain diffusions in an NFET device, in order to make an MOS capacitor.

The protective circuit disclosed by Bialas, et al also includes a first inverter 24 having an input 26 connected to the second node 8 and an output 28. The inverter 24 has an NFET depletion mode load 90 and an NFET enhancement mode active device 92.

The charging source 10 supplies charge to both the first node 8' and the second node 8 at least following a soft error event which has caused the first node 8' to become at least partially discharged during a first read interval following the first write interval.

In accordance with Bialas, et al, the first additional capacitance applied to the second node 8 prevents the second node 8 from recharging as fast as the first node following the soft error event, by sinking a portion of the charge supplied from the charging source 10 to the second node 8, so that thereby the first node 8' will resume its previously charged condition.

Although the Bialas, et al soft error protective circuit works well in protecting the latch 6 from the effects of electrostatic perturbations, its writing operations are not fast enough for some applications. In the Bialas, et al protective circuit, a first transfer field effect transistor device 30 has its source-drain path connected between the output of the inverter 24 and the gate electrode 22 of the first capacitor 18, and has its gate connected to the write-enable input 14, for applying a capacitance enhancing bias produced by the output of the first inverter 24 to the gate electrode 22 of the first capacitor 18 in the write interval when the write-enable input 14 is on, to apply the first additional capacitance to the second node 8. Device 30 in Bialas, et al is an NFET enhancement mode device. The Bialas, et al protective circuit further includes a ballast capacitor 32 which serves to maintain the floating potential which is applied to the gate 22 of the MOS capacitor 18 during read intervals when the output of the inverter 24 is disconnected by the transfer device 30 from the gate 22 of the MOS capacitor 18. The presence of the additional capacitance of the MOS capacitor 18 at the node 8 of the latch during the write interval when the write-enable signal is on, serves to slow down the writing operations of the latch, and the floating potential applied by the ballast capacitor 32 of Bialas, et al is susceptible, itself, to becoming discharged by cosmic rays.

OBJECTS OF THE INVENTION

It is therefore an object of the invention to protect a storage cell from soft errors, in an improved manner.

It is another object of the invention to minimize the effect of cosmic rays, alpha rays and other ionizing radiation on an integrated circuit latch, in an improved manner.

It a further object of the invention to speed up the writing operations of a soft error protected latch.

SUMMARY OF THE INVENTION

These and other objects, features and advantages are accomplished by the fast writing circuit invention disclosed herein. A fast writing circuit is disclosed for a soft error protected storage cell, such as a latch. The protected latch has a first input/output node and a second input/output node which are respectively connected to a charging source. The latch is connected to a first binary state input device which is enabled by a write-enable input, the first node being selectively charged during a write interval when the write-enable input is on, to represent a stored, first binary logic state for the latch. The soft error protection circuit includes an insulated gate, field effect capacitor having a diffusion electrode connected to the second node and having a gate electrode, for selectively loading the second node with an additional capacitance when its gate is biased with respect to the diffusion electrode. The soft error protection circuit further includes an inverter circuit having an input connected to the second node and an output for applying a capacitance enhancing bias to the gate electrode of the capacitor, for capacitively loading the second node. The fast writing circuit disclosed herein has an insulated gate field effect transistor disabling device having its source connected to ground potential, its drain connected to the gate of the capacitor and its gate connected to the write-enable input, for removing the bias on the gate of the capacitor in response to the write-enable input, thereby minimizing the capacitive load on the second node during the write interval. In this manner, the soft error protected latch can be written into at a faster rate than has been previously possible.

A first embodiment of the invention is disclosed as an NFET circuit embodiment for the fast writing circuit. This first embodiment is a switched capacitive hardened NMOS data latch circuit which is immuned to single event upsets up to approximately 7 picoCoulombs. The first embodiment is a high speed high performance circuit which dissipates relatively little power since there are no enlarged FET devices in the circuit. There is no process complexity for the circuit and it is much less temperature sensitive than prior art circuits. The NMOS embodiment is extendable to any data latch circuit design including storage cells in a memory array.

The second embodiment of the invention is a CMOS embodiment which is immuned to single event upsets which occur on either the high side or the low side of the latch.

DESCRIPTION OF THE FIGURES

These and other objects, features and advantages of the invention will be more fully appreciated with reference to the accompanying figures.

DISCUSSION OF THE PREFERRED EMBODIMENT

Figure 1:
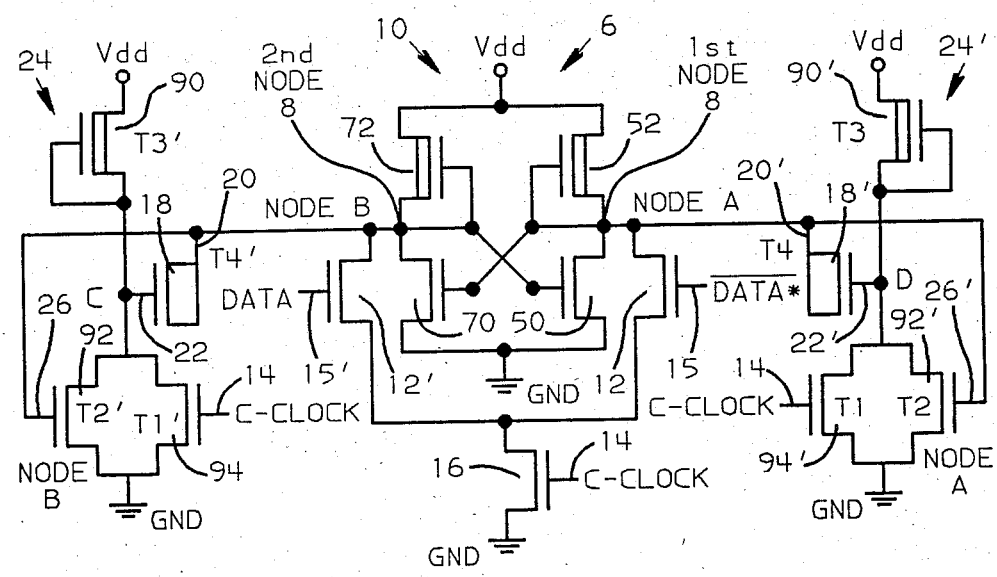
FIG. 1 is a circuit schematic diagram showing the fast writing circuit invention for a soft error protected storage cell.
Figure 2:
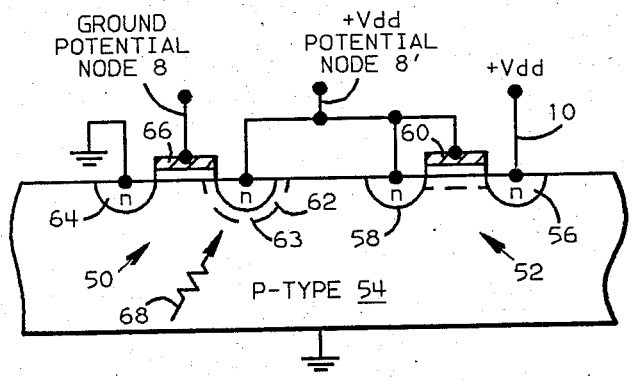
FIG. 2 is a cross-sectional view of the semiconductor structure of a portion of the latch 6, to illustrate how a cosmic ray can cause a soft error in the latch.
Figure 3:
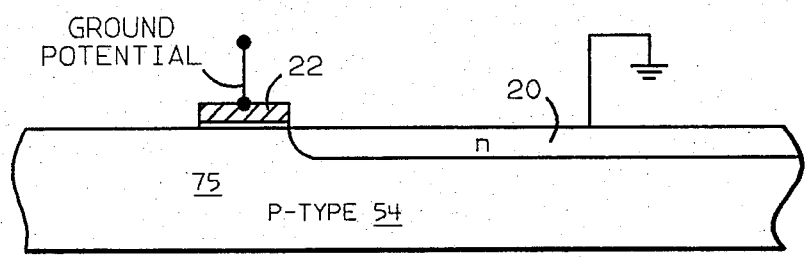
FIG. 3 is a cross-sectional view of the MOS capacitor 18, with no bias on the gate 22 with respect to the drain diffusion 20, thereby producing a relatively negligible gate-to-channel capacitance characteristic.
Figure 4:
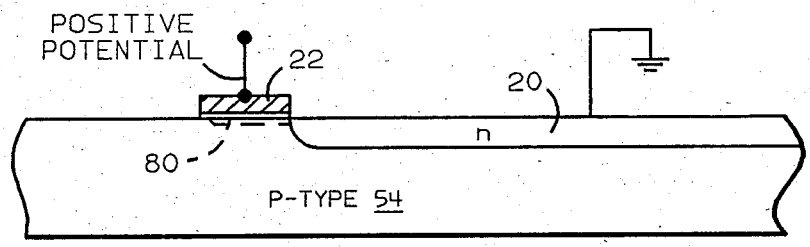
FIG. 4 is a cross-sectional view of the MOS capacitor 18, with a positive bias on the gate 22 with respect to the drain diffusion 20, which produces a charge mirror plate 80 which substantially increases the gate-to-channel capacitance over that of the zero bias condition of FIG. 3.

The NMOS embodiment for the fast writing circuit is described in FIGS. 1 through 7. In FIG. 1, the basic NMOS latch circuit is comprised of a bistable flip-flop storage element having the NMOS depletion mode load devices 52 and 72 and the NMOS enhancement mode active devices 50 and 70. The true value of binary data is applied at the gate 15' of the NMOS device 12' and the complement DATA* is applied at the gate 15 of the NMOS device 12. The NMOS devices 12 and 12' are connected through the C-clock (write-enable) NMOS transistor 16 which is gated by the C-clock at the gate 14. The DATA input, the DATA* input and the C-clock signals are used to "write" the latch. The latch circuit is written via the DATA and DATA* input signals but only at the time that the C-clock is activated or goes to high potential. In that manner, the DATA signals are latched by the circuit. It is when the C-clock is deactivated, that is the gate 14 is at a low potential, and data information is stored by the data latch, that the data latch circuit is highly susceptible to single event upset induced logic errors.

A circuit schematic diagram of the hardened latch in FIG. 1 adds the inverter sections 24 and 24'. The depletion mode devices 90 and 90' are equal loads and the active devices 92 and 92' are equally designed enhancement mode devices with their gates 26 and 26' respectively tied to the nodes 8 and 8' of the latch 6.

The NMOS capacitors 18 and 18' are equally designed enhancement mode devices having their respective diffusion electrodes 20 and 20' respectively connected to the nodes 8 and 8' of the latch 6. The essential function of the MOS capacitors 18 and 18' is to provide switched capacitive loading on the respective latch nodes 8 and 8'.

The enhancement mode devices 92 and 92' can be small to medium sized FET devices so as to not add any significant amount of additional gate capacitance to the latch nodes 8 and 8' respectively. In accordance with the fast writing circuit invention, the NMOS enhancement mode device 94 has its source-drain path connected between the gate 22 of the NMOS capacitor 18 and ground potential and it has its gate 14 connected to the C-clock. Further in accordance with the invention, the corresponding NMOS enhancement mode device 94' has its source-drain path connected between the gate 22' of the MOS capacitor 18' and ground potential and it has its gate 14 connected to the C-clock. In accordance with the invention, the devices 94 and 94' improve the speed response of the circuit by switching off the capacitive loading represented by the MOS capacitors 18 and 18' from their respective nodes 8 and 8' when the C-clock 14 turns on during a writing operation.

Note that in accordance with the invention, the inverter 24 consisting of the load device 90 and the active device 92 is a static inverter which inverts the logic value of the node 8 and applies the inverted logic value to the gate 22 of the MOS capacitor 18, gate 14 being at a low potential. When the node 8 is at a low potential, the static inverter 24 provides a constant high potential at the gate 22 of the MOS capacitor 18, thereby turning on the gate-to-channel capacitance of the capacitor 18, thereby capacitively loading the node 8. Note that the capacitance enhancing high potential applied by the inverter 24 to the gate 22 of the MOS capacitor 18 is constant and is continuously applied to the gate 22 as long as the node 8 is at relatively low potential. This is an important feature since there is no reliance placed upon a floating potential state at the gate 22. Thus, the steady application of a capacitance enhancing potential at the gate 22 enhances the immunity of the circuit to the effects of a single event upset in the vicinity of the inverter 24. A similar operation takes place for the inverter 24' connected to the node 8' of the latch 6.

Still further, it should be noted that when it is desired to write DATA into the latch 6, and the C-clock is turned on to its relatively high potential, the NMOS device 94 is turned on, thereby connecting the gate 22 of the MOS capacitor 18 to ground potential. This switches off the gate-to-channel capacitance of the MOS capacitor 18, thereby removing the capacitive loading on the node 8 when writing is to take place in the latch 6. A similar operation occurs for the NMOS device 94' which respectively switches off the gate-to-channel capacitance of the MOS capacitor 18' so that it does not load down the node 8' of the latch 6 when writing is to take place. In this manner, the capacitive loading on the nodes 8 and 8' of latch 6 is minimized during writing operations, thereby speeding up the writing operation for the latch.

If a direct, single event upset occurs to the high potential side of the latch, the latch's stored binary state will be restored by the circuit of FIG. 1. NMOS latches have only one sensitive node, the high potential side of the latch. Consider for example that the node 8' is at the relatively high potential which, by convention, means that the latch 6 has stored a binary "1" value. When a cosmic ray, for example, hits the node 8', the excess minority carriers or electrons that are collected by the node 8' cause a sharp, sub-nanosecond negative voltage transient at the node 8'. Generally, for a balanced, unhardened data latch, if the transient is large enough to cause the potentials at the nodes 8 and 8' to cross, then an error will result since the charging rate for either node 8 or 8' is equal and the higher the potential of a node, the more quickly will that node return to a high potential state. Therefore, for a hardened data latch, the principle behind the switched capacitive loading employing the MOS capacitors 18 and 18', is to slow the charging rate for the low potential side node 8 relative to the high potential side node 8' so that the latch 6 will recover its original true data state after any single event hit. If initially, the reverse situation existed, that is if the node 8 had been the high potential node and the node 8' had been the low potential node, then the MOS capacitor 18' would present the excess capacitive loading on the node 8' and that would provide the restoration for the latch 6.

Figure 5:
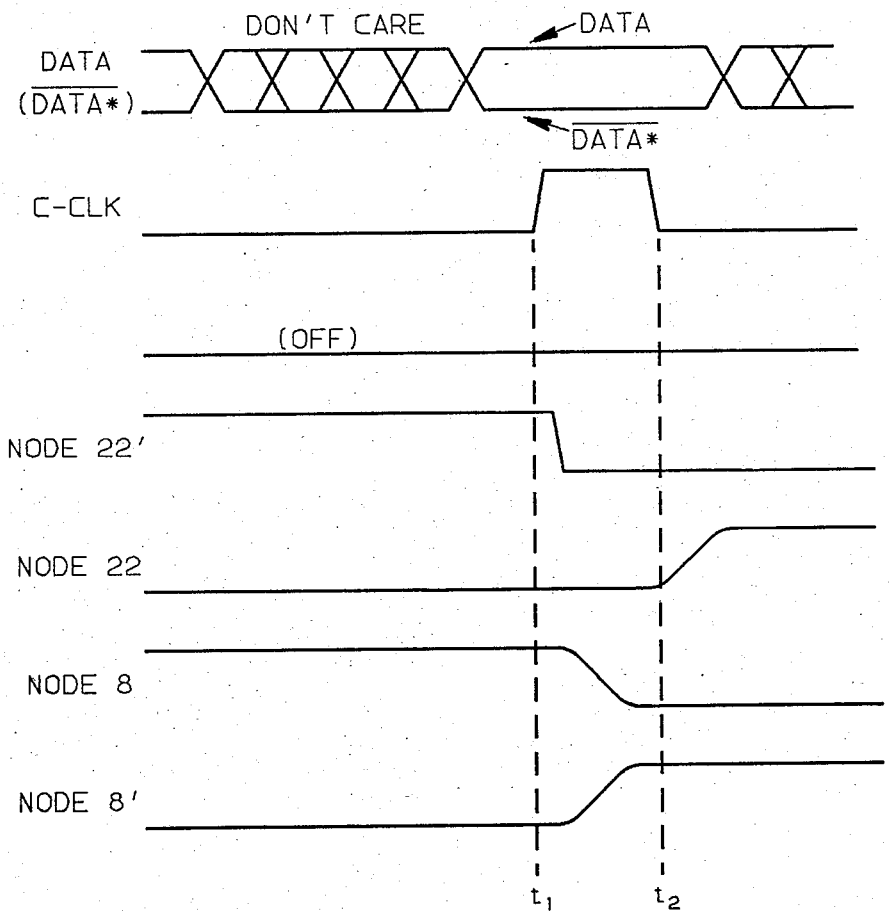
FIG. 5 is a timing diagram illustrating the operation of the first embodiment of the invention of FIG. 1.

Referring now to the timing diagram of FIG. 5, the operation of the fast writing circuit can be described. Assume an initial binary "0" state where the node 8' is at a low or ground potential and the node 8 is at the Vdd or high potential. When the C-clock goes from ground to positive potential, the node 22' drops to ground potential thereby removing the capacitive loading represented by the MOS capacitor 18' on the low potential node 8'. The DATA present at the gate 15' of the device 12' can then be written into the latch 6 at a fast rate because of the relatively low capacitive loading on the nodes 8 and 8'. The effect of applying a positive going signal at the gate 15' of the device 12' can be seen in the change in the potential of the node 8 from positive to ground and the change in the potential of the node 8' from ground to positive in the time interval between T1 and T2. When the node 8 drops to ground potential, and when the C-clock drops back to ground potential at time T2, it can be seen that the gate 22 of the MOS capacitor 18 rises to positive potential and this increases the gate-to-channel capacitive loading of the MOS capacitor 18 on the low potential node 8. This provides the single event upset immunity for the latch circuit 6 during the interval when the C-clock is at its low potential.

Figure 6:
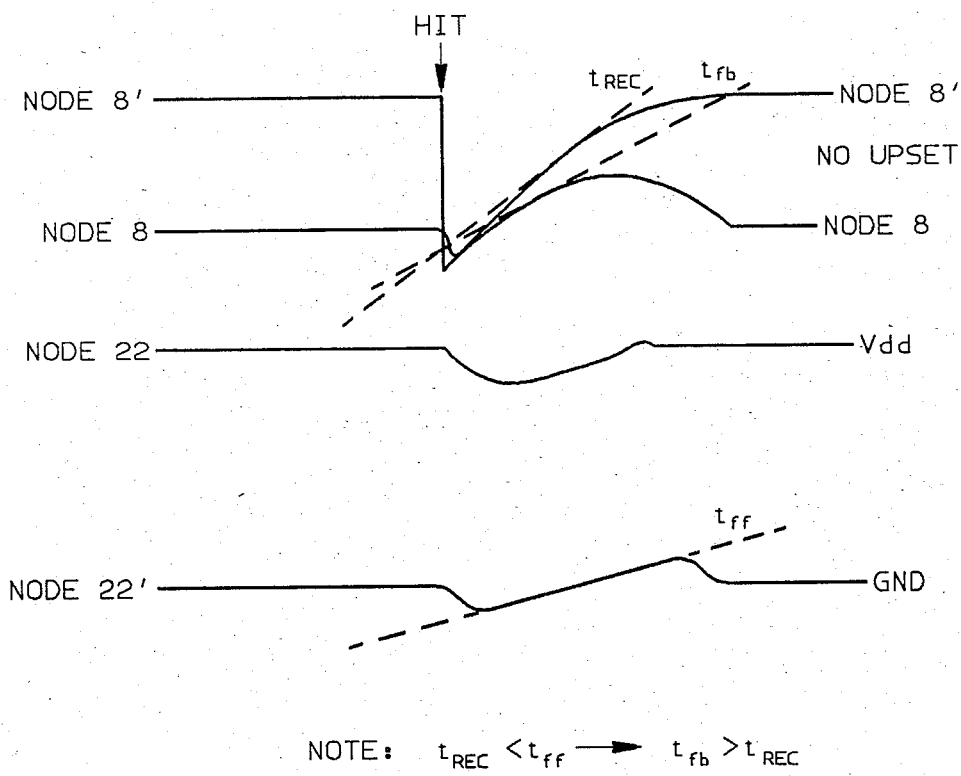
FIG. 6 is another timing diagram illustrating the response of the circuit of FIG. 1 to a single event upset.

Reference now to FIG. 6 will illustrate the response curves for a single event upset hit on the latch 6. For the single event upset hit response there are three charging time constants that are worthy of note. As is shown in FIG. 6, the potential of nodes 8, 8', 22 and 22' are illustrated. The time constant $T_{rec}$ which is shown in connection with the waveforms for nodes 8 and 8', illustrates the recovery time constant associated with response of the latch to recharging the hit node to its pre-hit high potential. This time constant $T_{rec}$ strongly depends on the design of the NMOS devices 52 and 72. The time constant $T_{ff}$ associated with the node 22', is the feed forward response of the hardening circuit which is connected to the hit node. The curves in FIG. 6 assume that a binary "1" state had been stored in the latch 6 so that the node 8' was at the Vdd or high potential and the node 8 was at ground or the low potential. Note that as the hit node 8' is momentarily discharged from its previous high potential by the single event, the control voltage of the hardening capacitor 18' connected to the hit node 8' momentarily begins to charge high. This response must be slowed relative to the time constant $T_{rec}$ in order to maintain the proper capacitive imbalance on the latch 6 to enable restoration of its original binary state. This can be done easily by the selected design of the load devices 90 and 90'. The design of the load devices 90 and 90' is noncritical to the performance of the latch and thus the functional response, including circuit speed of the latch, is unaffected by the design of the load devices 90 and 90'. A third time constant $T_{fb}$ associated with the waveforms 8 and 8' of FIG. 6, is the feedback response of the unhit side 8 of the data latch. This response is slowed relative to the time constant $T_{rec}$ due to the presence of the hardening capacitor 18 which capacitively loads the node 8. Thus, there are no upsets and the latch 6 is restored to its original binary storage state.

Figure 7:
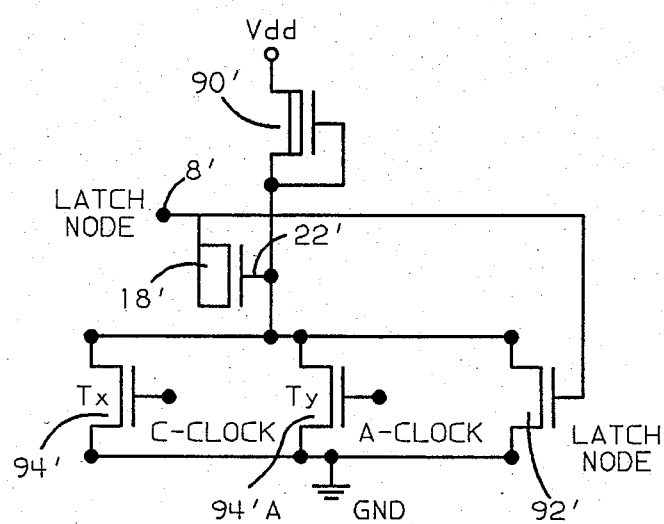
FIG. 7 illustrates a modification to the circuit of FIG. 1 wherein more than one write pass may be provided for the circuit.

FIG. 7 illustrates a modification which can be made to the inverter 24' in order to provide for alternate write paths for the latch. For example, in level sensitive scan design (LSSD) applications, if test bits are desired to be applied to the data latch, an A-clock must condition the latch to write in these test bits. In order to turn off the MOS capacitor 18' in FIG. 7 while the A-clock is high, an additional NMOS enhancement mode FET device 94A' is connected in parallel with the device 94', so as to turn off the capacitive loading represented by the MOS capacitor 18' when the A-clock turns on. This is accomplished in a manner similar to that described above for when the C-clock turns on.

The resulting switched capacitive hardened NMOS data latch circuit is single event upset immuned up to approximately 7 picoCoulombs, has a high speed high performance characteristic and a low power dissipation characteristic and can be achieved without manufacturing process complexities. The circuit is far less temperature sensitive than are prior art circuits and the design is extendable to any data latch circuit and memory array storage cell circuit.

Second Embodiment—CMOS Circuit

FIGS. 8 through 13 illustrate a second embodiment of the fast writing circuit, for a CMOS circuit. Unlike NMOS latches which are susceptible to single event upsets (SEU's) only on one side of the latch (the high side), CMOS data latches are susceptible on both sides, since on both sides, the data node is partly comprised of a strongly reverse-biased drain diffusion. On the high side of the CMOS latch, the NFET drain region is strongly reverse-biased and a single event hit on the node would cause a negative voltage transient due to the collection of excess electrons from the P substrate (well). On the low side of the CMOS latch, the PFET drain region is strongly reverse-biased and thus a single event hit on the node would cause a positive voltage transient due to the collection of excess holes from the N substrate (well). The switched capacitance hardening circuit for CMOS latches causes a capacitive imbalance on the latch while the latch is susceptible to SEU's. When a single event hit occurs on the node where the capacitive imbalance is *not* present, the capacitive imbalance insures SEU immunity by altering the charging-/discharging rate of the unhit node with respect to the hit node. When a single event hit occurs on the node where the capacitive imbalance *is* present, the capacitive imbalance insures SEU immunity by effectively altering the effect due to the single event hit (i.e. the magnitude of the resultant voltage transient) by the increased capacitive loading on the affected node. (That is, the critical charge for upset (Q-crit) of the node with the capacitive loading imbalance is insurmountably high, thus insuring SEU immunity.)

Figure 8:
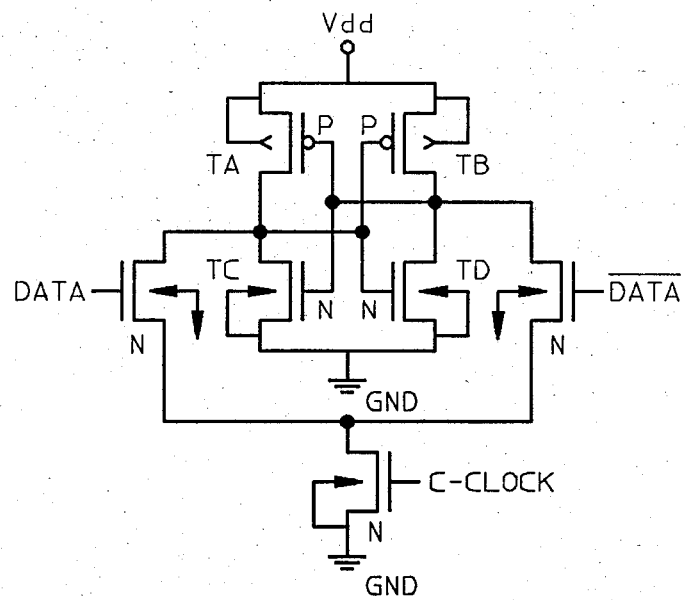
FIG. 8 is a circuit schematic diagram of a basic, unhardened CMOS data latch circuit with an active high C-clock.
Figure 9:
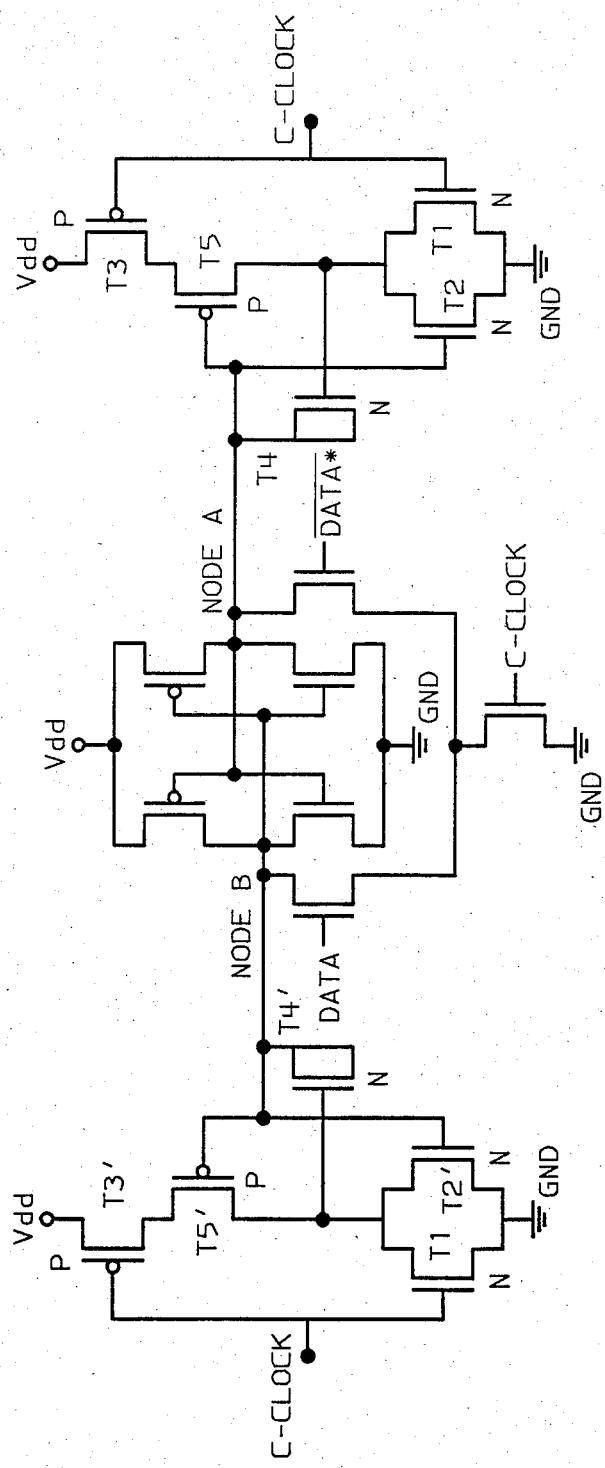
FIG. 9 is a circuit schematic diagram of the second embodiment of the invention, the CMOS version of the fast writing circuit for a soft error protected storage cell. The embodiment of FIG. 9 is for an active high C-clock.

High performance, SEU immune CMOS data latch circuit designs will now be described. The circuit schematics for a basic unhardened CMOS data latch are shown in FIG. 8. The design assumes an active high level C-clock (i.e. the latch is written when the C-clock goes high). The schematics of the novel switched capacitance hardened version of this same CMOS latch circuit are shown in FIG. 9. In this design a switched capacitive loading SEU hardening circuit is attached to each node of the basic CMOS latch. (For some designs of basic CMOS latches, a C-clock gated PFET is also a part of the basic latch design. Devices T2 and T2' are equally-designed minimum-size NFET's. Devices T5 and T5' are equally-designed minimum-size PFET's. Devices T3 and T3' are also equally-designed minimum-size PFET's. Devices T4 and T4' are equally-designed NFET's connected as shown to function as switched MOS capacitors. T4 and T4' must be designed to have two (or only one) small self-aligned diffusion region(s). All MOSFET's are enhancement type.

When DATA has been latched into the latch circuit of FIG. 9 and the latch is susceptible to an SEU error (i.e. when the C-clock is deactivated (low)), the capacitive hardening circuit connected to each latch node (T1, T2, T3, T4, T5 on node A and T1, T2', T3', T4', T5' on node B) sets the switched MOS capacitor (device T4 or device T4') such that it loads the low side of the latch. That is, if node A is high, then node B is low, node C is high, and node D is low, thus T4' loads node B since it is on (gate is high) and its drain and source (node B) is low. T4 is off (gate is low) and thus it does not load node A. If a heavy ion strikes node A and the potentials of node A and node B cross, the T4' loading slows the charging of node B relative to node A so that A goes high and B remains low—recovery—no upset. If a heavy ion strikes node B, the amount of excess charge the heavy ion would need to deposit on the node to cause an upset-causing voltage transient is insurmountably high due to the presence of the capacitive loading imbalance and due to the limit on the maximum possible linear charge deposition rate of the most intense heavy ion (0.3 picoCoulombs per micron for 150 MeV Krypton). Stated differently, the switched capacitive loading on the low side node has the effect of raising the critical charge for upset due to a single event hit to the low side node such that an upset is an impossibility. The switched capacitance hardened CMOS latch circuit is SEU immune from hits to either side of the latch.

Figure 10:
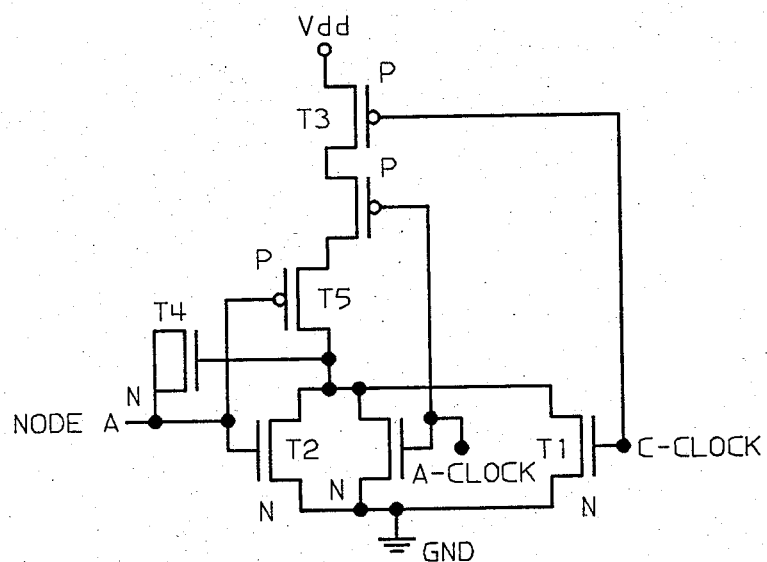
FIG. 10 is a circuit schematic diagram of a portion of the switched capacitance hardening circuit of FIG. 9, illustrating a modification to provide for two write paths, with active high write clocks.
Figure 11:
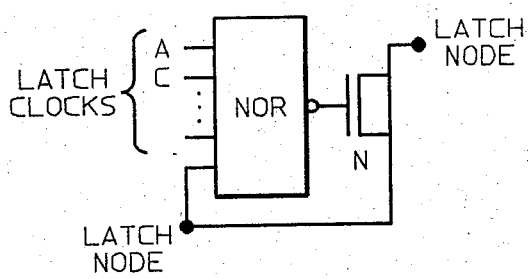
FIG. 11 is a logic representation for a switched capacitive loading single event upset hardening circuit for CMOS data latch circuits, employing active high write clocks.

The extendability of the switched capacitive loading SEU hardening circuit to latches of any design is easily implemented. For example, the switched capacitance hardening circuit that would be attached to each data node of a latch circuit that had two clock-controlled write paths is shown in FIG. 10. The general logic representation of the switched capacitance circuit for active high level clock CMOS data latches is shown in FIG. 11.

The speed response of these switched capacitance hardened CMOS data latches is maintained since the capacitive loading imbalance is removed when the write clock(s) are activated. That is, when C-clock goes high, the gate of the switched MOS capacitor is discharged low, the device is then off. Thus the large gate-to-channel capacitive load is removed and circuit speed is maintained.

Figure 13:
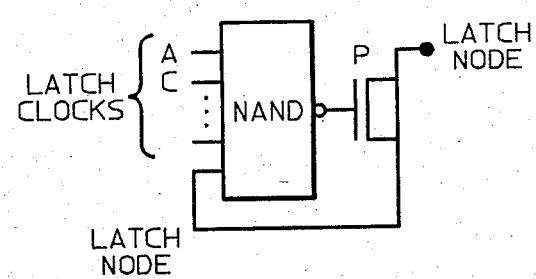
FIG. 13 is a logic representation of a switched capacitive loading single event upset hardening circuit for CMOS data latch circuits having active low write clocks, such as the circuit in FIG. 12.
Figure 12:
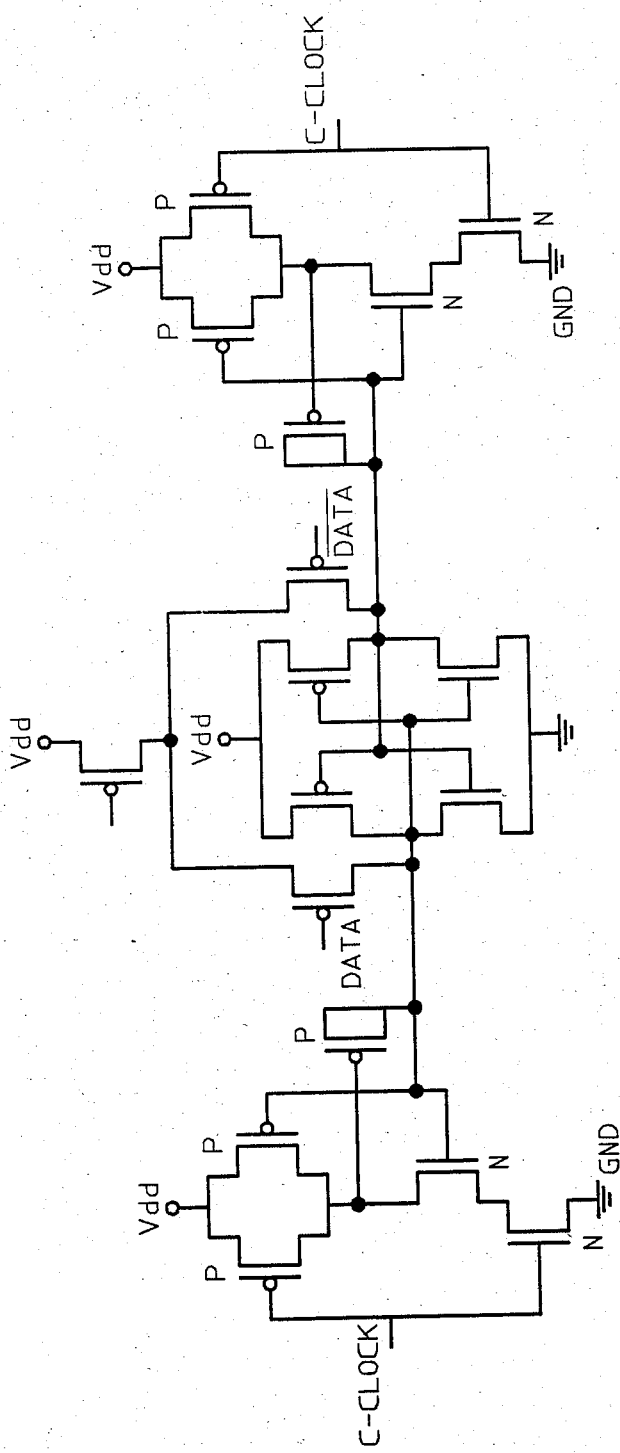
FIG. 12 is a circuit schematic diagram of a modified version of the CMOS circuit of FIG. 9, which accommodates an active low C-clock.

The novel design of a switched capacitance hardened CMOS latch circuit with active low write clock (C-clock) is shown in FIG. 12. Note, that for this circuit design the switched MOS capacitors are PFET's and the capacitive imbalance is created on the high side node. Otherwise, the basic operation is essentially the same as previously described. Again, the hardening circuit design is extendable to any CMOS latch circuit design and the speed response of the latch circuit is maintained. The general logic representation for the switched capacitive loading SEU hardening circuit for CMOS latch circuits with active low write clocks is shown in FIG. 13.

The resulting switched capacitive hardened CMOS data latch circuit is single event upset immune and has a high speed high performance characteristic while dissipating very low power. The circuit does not require changes in the basic manufacturing process techniques for CMOS circuits and the circuit is far less temperature sensitive than are those circuits in the prior art. The circuit is extendable to any data latch circuit design or memory array cell design.

Although a specific embodiment of the invention has been disclosed, it will be understood by those having skill in the art that the foregoing and other changes in form and detail may be made without departing from the spirit and the scope of the invention.

What is claimed is:

1. A fast writing circuit for a soft error protected storage cell, the protected storage cell having a first node and a second node which are respectively connected to a charging source, said storage cell being connected to a first binary state input device which is enabled by a write-enable input, said first node being selectively charged during a write interval when said write-enable input is on, to represent a stored, first binary logic state for said storage cell, the soft error protection circuit including an insulated gate, field effect capacitor having a diffusion electrode connected to said second node and having a gate electrode, for selectively loading said second mode with an additional capacitance when its gate is biased with respect to said diffusion electrode, said soft error protection circuit further including an inverter circuit having an input connected to said second node and an output for applying a capacitance enhancing bias to said gate electrode of said capacitor, for capacitively loading said second node, wherein the improvement comprises:

an insulated gate field effect transistor disabling device having its source connected to a reference potential, its drain connected to said gate of said capacitor and its gate connected to said write-enable input, for removing said bias on said gate of said capacitor in response to said write-enable input, thereby minimizing the capacitive load on said second node during said write interval;

whereby said soft error protected storage cell can be written into at a faster rate than has been previously possible.

2. A fast writing circuit for a soft error protected storage cell, the protected storage cell having a first node and a second node which are respectively connected to a charging source, said storage cell being connected to a first binary state input device which is enabled by a write-enable input, said first node being selectively charged during a write interval when said write-enable input is on, to represent a stored, first binary logic state for said storage cell, the soft error protection circuit including an insulated gate, field effect capacitor having a diffusion electrode connected to said second node and having a gate electrode, for selectively loading said second with an additional capacitance when its gate is biased with respect to said diffusion electrode, wherein the improvement comprises:

an inverter circuit having an input connected to said second node and an output directly connected to said gate of said capacitor, for constantly applying a capacitance enhancing bias to said gate electrode of said capacitor when said write-enable input is off, for capacitively loading said second node when said write interval is absent;

an insulated gate field effect transistor disabling device having its source connected to a reference potential, its drain connected to said gate of said capacitor and its gate connected to said write-enable input, for removing said bias on said gate of said capacitor in response to said write-enable input turning on, thereby minimizing the capacitive load on said second node during said write interval;

whereby said soft error protected storage cell has an enhanced immunity from soft errors and it can be written into at a faster rate than has been previously possible.

3. A fast writing circuit for a soft error protected latch, the protected latch having a first input/output node and a second input/output node which are respectively connected to a charging source, said latch being connected to a first binary state input device which is enabled by a write-enable input, said first node being selectively charged during a write interval when said write-enable input is on, to represent a stored, first binary logic state for said latch, the soft error protection circuit including an insulated gate, field effect capacitor having a diffusion electrode connected to said second node and having a gate electrode, for selectively loading said second with an additional capacitance when its gate is biased with respect to said diffusion electrode, said soft error protection circuit further including an inverter circuit having an input connected to said second node and an output for applying a capacitance enhancing bias to said gate electrode of said capacitor, for capacitively loading said second node, wherein the improvement comprises:

an insulated gate field effect transistor disabling device having its source connected to ground potential, its drain connected to said gate of said capacitor and its gate connected to said write-enable input, for removing said bias on said gate of said capacitor in response to said write-enable input, thereby minimizing the capacitive load on said second node during said write interval;

whereby said soft error protected latch can be written into at a faster rate than has been previously possible.

4. A fast writing circuit for a latch soft error protection circuit, the protected latch having a first input/output node and a second input/output node which are respectively connected to a charging source, said latch being connected to a first binary state input device which is enabled by a write-enable input, said first node being selectively charged during a write interval when said write-enable input is on, to represent a stored, first binary logic state for said latch, the soft error protection circuit including an insulated gate, field effect capacitor having a diffusion electrode connected to said second node and having a gate electrode, for selectively loading said second node with an additional capacitance when its gate is biased with respect to said diffusion electrode, said soft error protection circuit further including an inverter circuit having an input connected to said second node and an output for applying a capacitance enhancing bias to said gate electrode of said capacitor, for capacitively loading said second node, said charging source supplying charge to both said first node and said second node following a soft error event which has caused said first node to become at least partially discharged during a read interval following said write interval, said additional capacitance applied to said second node preventing said second node from recharging as fast as said first node following said soft error event, by sinking a portion of the charge supplied from said charging source to said second node, the improvement comprising:

an insulated gate field effect transistor disabling device having its source connected to ground potential, its drain connected to said gate of said capacitor and its gate connected to said write-enable input, for removing said bias on said gate of said capacitor in response to said write-enable input, thereby minimizing the capacitive load on said second node during said write interval;

whereby said soft error protected latch can be written into at a faster rate than has been previously possible.

* * * * *